(12) United States Patent
Campbell

(10) Patent No.: US 9,276,538 B2
(45) Date of Patent: Mar. 1, 2016

(54) LOW NOISE AMPLIFIER DRAIN SWITCH CIRCUIT

(71) Applicant: TriQuint Semiconductor, Inc., Hillsboro, OR (US)

(72) Inventor: Charles F. Campbell, McKinney, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 14/222,454

(22) Filed: Mar. 21, 2014

(65) Prior Publication Data

US 2015/0270817 A1 Sep. 24, 2015

(51) Int. Cl.
*H03F 1/14* (2006.01)
*H03F 3/72* (2006.01)

(52) U.S. Cl.
CPC .............. *H03F 3/72* (2013.01); *Y10T 29/49117* (2015.01)

(58) Field of Classification Search
CPC .............. H03F 2200/372; H03F 1/302; H03F 2203/45511; H03F 2203/45528; H03F 2203/45684; H03F 2203/45696; H03F 2203/45722; H03F 3/45089; H03F 1/26; H03F 1/34; H03F 3/082; H03F 3/12; H03F 3/26; H03F 3/72; H03F 1/0277; H03F 2200/36; H03F 1/08; H03F 3/45475; H03F 3/02; H03F 1/50; H03F 3/1935; H03F 3/193; H03F 3/195; H03G 1/0088; H01L 2924/3011; H01L 23/66
USPC .............. 330/51, 98, 150, 277, 307, 310, 311
See application file for complete search history.

(56) References Cited

U.S. PATENT DOCUMENTS

| | | | | |
|---|---|---|---|---|
| 4,987,382 A * | 1/1991 | Saitoh | ............................ | 330/310 |
| 5,777,517 A * | 7/1998 | Seshita | .......................... | 330/277 |
| 6,496,070 B2 * | 12/2002 | Kubota | ........................... | 330/277 |
| 7,183,853 B2 * | 2/2007 | Wada et al. | .................... | 330/260 |

* cited by examiner

*Primary Examiner* — Khanh V Nguyen
(74) *Attorney, Agent, or Firm* — Withrow & Terranova, P.L.L.C.

(57) ABSTRACT

Embodiments include an apparatus, system, and method related to a switch circuit. Specifically, embodiments relate to a low noise amplifier (LNA) drain switch circuit that includes a first field effect transistor (FET) where the drain contact of the first FET is coupled with a gate contact of a second FET. The drain contact of the second FET may also be coupled with the gate of the second FET through a resistor. The source contact of the second FET may be coupled with a diode which may be coupled with an LNA.

20 Claims, 6 Drawing Sheets

LOW NOISE AMPLIFIER DRAIN SWITCH CIRCUIT

FIELD

Embodiments of the present disclosure relate generally to the field of circuits, and more particularly to switching circuits.

BACKGROUND

Some integrated circuits (ICs) may include separate transmit and receive paths. In some cases, a low noise amplifier (LNA) may be positioned in the receive path of the IC. In some cases where the IC is in transmit mode, that is signals are being transmitted along the transmit path of the IC, it may be desirable to turn off or shut down the LNA. Specifically, because the receive path may not be fully isolated from the transmit, it may be desirable to turn the LNA off to prevent a signal from feeding back through the receive path due to unintended amplification by the LNA. In some cases, the signal feedback may result in a degraded transmission signal, for example by causing discontinuities in the compression mode characteristics of the IC.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Figure 1:
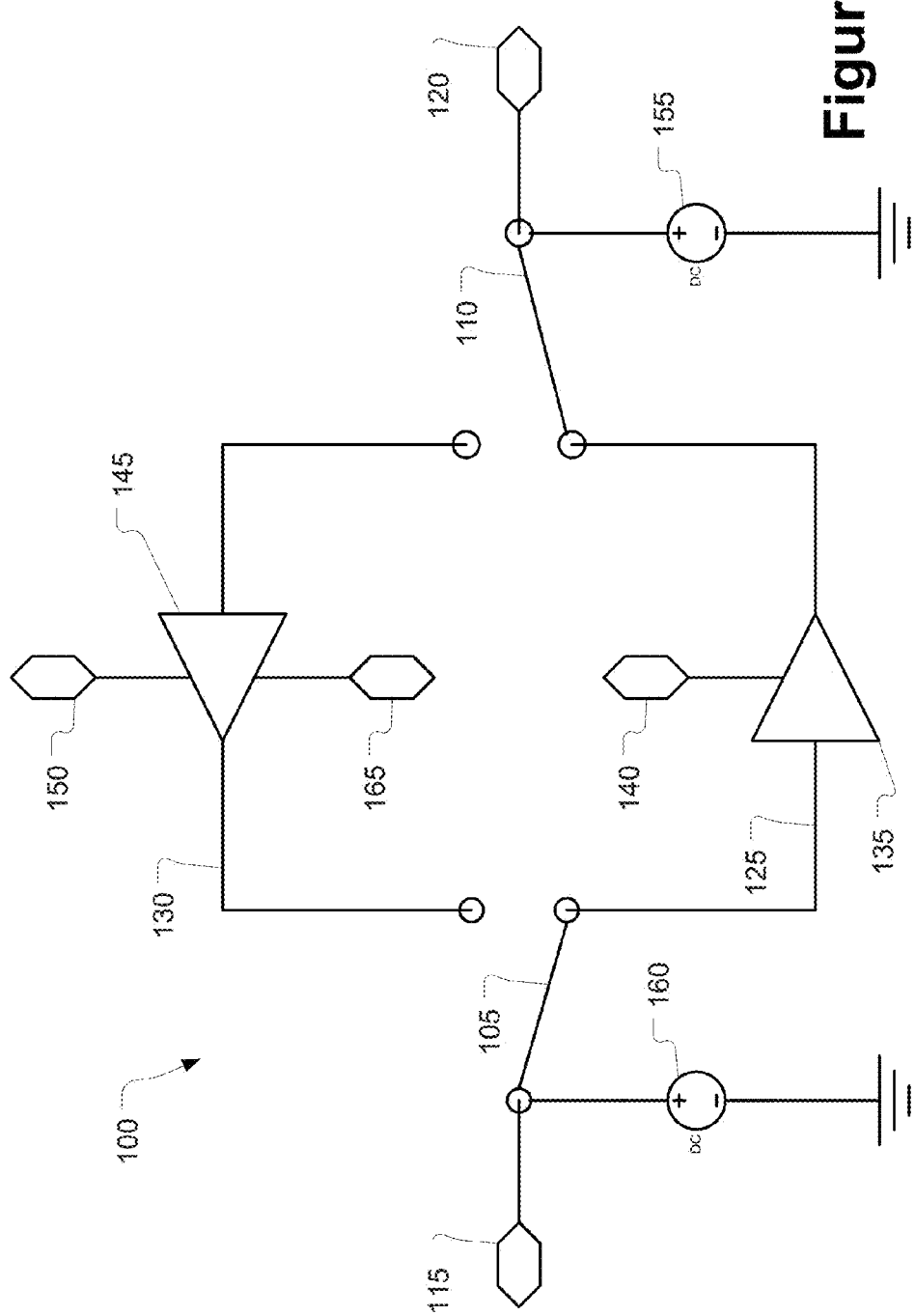
FIG. 1 illustrates an example block diagram of a monolithic microwave integrated circuit (MMIC), in accordance with various embodiments.

Embodiments include a low noise amplifier (LNA) drain switch circuit in an integrated circuit (IC) that includes a transmit path and a receive path. The LNA drain switch circuit may include a first field effect transistor (FET) where the drain contact of the first FET is coupled with the gate contact of a second FET. The drain contact of the second FET may be coupled with its gate contact. The source contact of the second FET may be coupled with a diode which may be coupled with an LNA. The gate contact of the first FET may be coupled with a control voltage supply configured to supply either a negative voltage or zero voltage. The drain contact of the second FET may be coupled with a drain voltage supply configured to provide a positive voltage. In embodiments, when the control voltage supply provides a negative voltage, the current from the drain voltage supply may flow through the second FET into the LNA. When the control voltage supply provides zero voltage, the second FET may turn off and draw very little current. The diodes between the FETs and the LNA may reduce the voltage and current seen at the LNA when the second FET is off independent of the LNA gate voltage.

The control voltage supply may provide the negative voltage when the IC is in a receive mode, and the LNA coupled with the LNA drain switch circuit may work to amplify signals that the IC is receiving. Likewise, the control voltage supply may provide zero voltage when the IC is in a transmit mode. The reduced voltage and current that may result from the LNA drain switch circuit due to the control voltage supply providing zero voltage may effectively turn the LNA off so that the LNA does not feed back undesired signals along the receive path.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

FIG. 1 depicts an example of a monolithic microwave integrated circuit (MMIC) 100. In embodiments, the MMIC 100 may be implemented on a 0.15-micron-gate-length gallium nitride (GaN) grown on a 50 micron thick silicon carbide (SiC) substrate, known as GaN15, though in other embodiments the MMIC 100 may be implemented on GaN or SiC having a different gate-length or different thickness, for example an arbitrary gate-length or thickness, or on Gallium arsenide (GaAs) or some other material. In some embodiments the gate-length may be, for example, 0.25 microns long, 0.5 microns long, or some other length. In some embodiments, the SiC substrate may be 25 microns thick, 100 microns thick, 150 microns thick, or some other thickness.

The MMIC 100 may include two single-pole double-throw (SPDT) switches 105 and 110. SPDT switch 105 may be coupled with a transceiver input/output terminal 115. The transceiver input/output terminal 115 may be coupled with a transceiver that may include integrated transmit and receive circuitry, or separate transmit circuitry and receive circuitry. The MMIC 100 may further include an antenna terminal 120. The antenna terminal 120 may be configured to transmit a signal to, or receive a signal from, one or more antennas (not shown). SPDT switch 110 may be coupled with antenna terminal 120.

The MMIC 100 may include a separate transmit path 125 and receive path 130. The transmit path 125 may include a power amplifier (PA) 135 coupled with a drain voltage supply 140 configured to receive a drain voltage at the PA 135. In some embodiments, the drain voltage of the PA 135 may be on the order of 20 volts (V), though in other embodiments the drain voltage may be greater or less when the PA 135 is activated. Similarly, the receive path 130 may include a low noise amplifier (LNA) 145 coupled with a drain voltage supply 150 configured to receive a drain voltage at the LNA 145. The LNA 145 may be a "high gain" LNA. In some embodiments the drain voltage of the LNA 145 may be 10V when the LNA 145 is activated, while in other embodiments it may be greater or less.

In embodiments, the SPDT switches 105 and 110 may be voltage controlled. For example, in one embodiment a switch control voltage of −20V may be applied to the SPDT switch 105 from a control voltage supply 160, and in response the SPDT switch 105 may couple the transceiver input/output terminal 115 to the transmit path 125. At the same time, a switch control voltage of 0V may be applied to SPDT switch 110 by another control voltage supply 155 to couple the antenna terminal 120 to the transmit path 125. Further, in some embodiments a switch control voltage of 0V may be applied to SPDT switch 105 by control voltage supply 160 to couple the transceiver input/output terminal 115 to the receive path 130, and a switch control voltage of −20V may be applied by control voltage supply 155 to SPDT switch 110 to couple the antenna terminal 120 to the receive path 130. In other embodiments, the switch control voltages may be switched or different from the voltages described above such that, for example, a voltage of −20V causes SPDT switch 105 to couple the transceiver input/output terminal 115 to the receive path 130 while a voltage of 0V causes SPDT switch 110 to couple the transceiver input/output terminal 115 to the transmit path 125. In other embodiments, the control voltages may be greater or lesser than the −20V or 0V described above. Note that in some embodiments, the control voltage supply 160 coupled to SPDT switch 105 may be the same control voltage supply 155 coupled to SPDT switch 110, but one or more intervening components may be used to ensure that the control voltage of −20V is going to SPDT switch 105 when the control voltage of 0V is going to SPDT switch 110, and vice versa. As shown in FIG. 1, SPDT switches 105 and 110 are coupled with the transmit path 125, though it will be understood based on the description above that application of a switch control voltage to the SPDT switches 105 and 110 may cause them to couple with the receive path 130. Although the various switch control voltages described above are described as −20V or 0V, in some embodiments the switch control voltages may not be precisely −20V or 0V. Rather, in some embodiments the switch control voltages may be approximately −20V or approximately 0V. For example, in some embodiments the switch control voltages may have a positive or negative variance which may be process and/or technology dependent.

In MMIC 100 where the switches 105 and 110 are configured to couple the transceiver input/output terminal 115 and the antenna terminal 120 to the transmit path 125, it may be desirable to turn off or shut down the LNA 145. Specifically, because the SPDT switches 105 and 110 may not fully isolate the receive path 130 from the transmit path 125, it may be desirable to turn the LNA 145 off to prevent the signal at the antenna terminal 120 from feeding back to the transceiver input/output terminal 115 through the receive path 130. In some cases, the signal feedback may result in a degraded transmission signal, for example by causing discontinuities in the compression mode characteristics of the MMIC 100.

In some existing solutions, the LNA 145 may be switched off by applying a negative voltage to a gate bias line of the LNA 145, which may be sufficient to pinch off one or more field effect transistors (FETs) of the LNA 145. In some embodiments that negative voltage may be on the order of −5V. The negative voltage may be provided from a gate voltage source 165, as discussed in greater detail below.

However, in some cases the difference between the radio frequency (RF) power levels of the receive path 130 and the transmit path 125 may be significant. For example, the power level of the transmit path 125 may be on the order of 5 watts (W) to 100 W. However, the power level of the receive path 130 may be on the order of less than 1 milliwatt (mW).

Additionally, a GaN transistor such as the MMIC 100 may self bias when driven with RF power, even if the MMIC 100 is biased in pinch off. In other words, when the transmit path 125 sees RF power, the MMIC 100 may draw current which may be seen in the receive path 130 as discussed above. Additionally, it may be known that GaN field effect transistors (FETs) such as those that may be present in an LNA such as LNA 145 may exhibit improved noise performance when operated with a drain voltage ($V_d$) of approximately 10V.

In some cases, a solution to one or more of the above described undesirable characteristics of the MMIC 100 may be to increase the isolation of the switches 105 and 110. However, increasing the isolation of the switches 105 and 110 may increase the insertion loss of the switches 105 and 110, which may reduce the overall circuit performance. Additionally, increasing the isolation of the switches 105 and 110 may increase die area and circuit complexity of the MMIC 100 or a system utilizing the MMIC 100.

Figure 2:
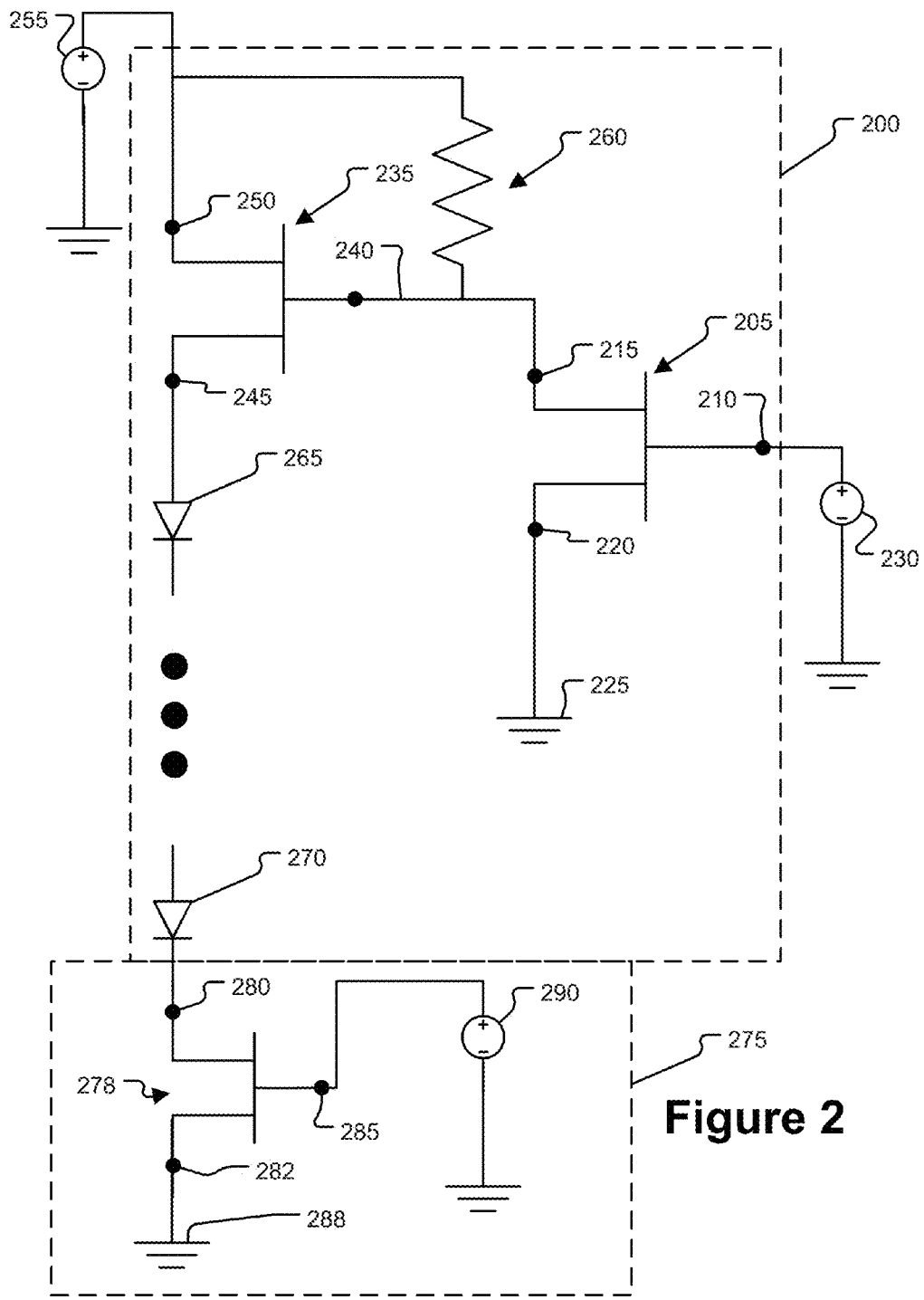
FIG. 2 illustrates an example of an LNA drain switch, in accordance with various embodiments.

FIG. 2 depicts an example of an LNA drain switch circuit 200 that may be used in the MMIC 100 described above to reduce or eliminate one or more of the undesirable characteristics of the MMIC 100 described above. Specifically, the LNA drain switch circuit 200 may be coupled with the drain voltage supply 150 of the LNA 145. The LNA drain switch circuit 200 may include a FET 205 having a gate contact 210, a drain contact 215, and a source contact 220. The source contact 220 may be coupled with ground 225. The FETs 205 and 235 may be depletion mode FETs. The gate contact 210 may be coupled with a control voltage supply 230, as will be described in greater detail below.

The LNA drain switch circuit 200 may include a second FET 235 having a gate contact 240, a source contact 245, and a drain contact 250. The drain contact 250 of the second FET 235 may be coupled with a drain voltage supply 255 which may be similar to drain voltage supply 150. The drain contact 215 of the FET 205 may be coupled with the gate contact 240 of the second FET 235. The drain contact 215 of the FET 205 may also be coupled with a resistor 260 that is electrically positioned between the drain contact 215 and the drain voltage supply 255. As will be described below, in some embodiments the resistor 260 may have a relatively high value on the order of 50000 ohms (Ω). In other embodiments, the resistor 260 may have a greater or lower value.

The source contact 245 of the second FET 235 may be coupled with one or more diodes such as diodes 265 and 270. As indicated by the ellipses, additional diodes may be used. For example, in some embodiments three or more diodes may be used. In other embodiments, only a single diode may be used. The diodes, for example the nth diode 270, may be coupled with an LNA 275 which may be similar to LNA 145. The LNA 275 may include a FET 278 with a drain contact 280, source contact 282 and gate contact 285. The source contact 282 may be coupled with ground 288. The gate contact may be coupled with a gate voltage source 290, which may be similar to gate voltage source 165 described above. The gate voltage source may be configured to provide, for example, −2.4V to the gate contact 285. The LNA 275 is depicted as a very simplified version of an LNA 275, and in other embodiments the LNA 275 may include a greater or less number of components.

Figure 3:
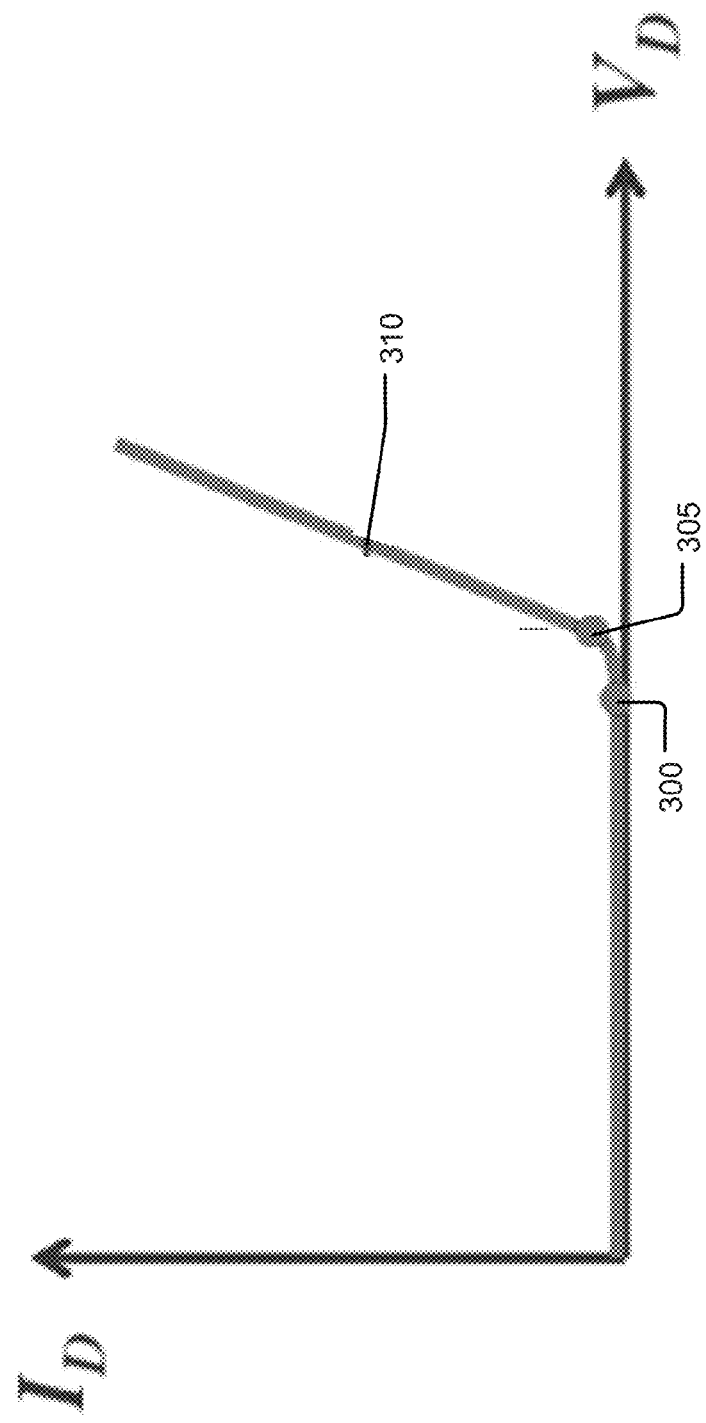
FIG. 3 illustrates an example of a voltage-current curve of a diode, in accordance with various embodiments.

Before discussing the operation of the LNA drain switch circuit 200, it may be useful to briefly describe the function of a diode such as diodes 265 and 270. FIG. 3 depicts an example of a voltage-current curve of a diode such as diodes 265 and 270.

In some cases a diode may perform a gating function for relatively low voltages. As shown in FIG. 3, as voltage increases, the current passed through the diode may be 0 or approximately 0 amps (A). When the voltage reaches a threshold level, such as the voltage shown at element 300 of FIG. 3, the current may begin to increase as voltage increases. As shown in FIG. 3, the voltage may only increase slightly with a change in current until a specific voltage at 305. Then, the voltage may increase more significantly in an approximately linear fashion such as is shown at element 310 of FIG. 3.

Returning to FIG. 2, operation of the LNA drain switch circuit 200 may be described. Specifically, the control voltage supply 230 may be the control voltage supply 160 of SPDT switch 105 or the control voltage supply 155 of SPDT switch 110. Specifically, the control voltage supply 230 may be whichever of the control voltage supplies 160 or 155 output a control voltage of −20V when the SPDT switches 105 and 110 are coupled with the receive path 130. In the example discussed above with respect to FIG. 1, the control voltage supply 230 would be the control voltage supply 155. However, as discussed above, in other embodiments the control voltage supply 160 may output a voltage of −20V to couple the SPDT switch 105 to the receive path 130. In that embodiment, the control voltage supply 230 may be the control voltage supply 160. Note that in other embodiments the control voltage may be different than −20V, but −20V is used herein for the purposes of this example.

The drain voltage supply 255 may be configured to provide a positive voltage, for example 20V and the LNA drain switch circuit 200 may be configured to operate at approximately 40 milliamps (mA). However, in other embodiments a different drain voltage, or a different current, may be supplied, but for the purpose of this example the drain voltage will be described as 20V and the current will be described as 40 mA. When the MMIC 100 is in receive mode, that is the SPDT switches 105 and 110 are coupled with the receive path 130, the LNA drain switch circuit 200 may see a voltage of −20V at the gate contact 210 of FET 205. The negative voltage at the gate contact 210 may result in the FET 205 turning off, that is not drawing current (or drawing very little current in the form of leakage current) from the drain voltage supply 255 from the drain contact 215 to the source contact 220 and thereby to ground 225.

Because the FET 205 is turned off and not drawing current (or is drawing very little current), then there will be very little voltage drop across resistor 260 to the voltage supplied by the drain voltage supply 255 seen at the gate contact 240 of FET 235. Specifically, because voltage is equal to current multiplied by resistance, because there is no current (or very little current) being drawn through resistor 260, the change in voltage across resistor 260 will be very low and approximately 0. Therefore, the voltage at the gate contact 240 will be approximately 20V. In this example where the value of resistor 260 is 50000Ω, the voltage at gate contact 240 may be 19.7 V due to a small amount of gate leakage current for FET 235.

The diodes 265 and 270 may be selected to cause a voltage drop between the drain voltage supply 255 and the LNA 275. For example, in some embodiments there may be four separate diodes. The diodes may combine to cause the voltage to decrease from the voltage of approximately 20V across FET 235 to a voltage of approximately 10V as measured at drain contact 280. The current may still be approximately 40 mA at the LNA 275. A different number or type of diodes may be used to increase or decrease the voltage drop from the drain voltage supply 255 as measured at the drain contact 280. Specifically, a greater number of diodes may cause the voltage drop to increase, while a lower number of diodes may cause the voltage drop to decrease.

In some embodiments, the voltage measured at the drain contact 280 may be dependent on the operational drain voltage of the LNA 275. For example, 10V may be a desirable voltage for the drain contact 280 because LNA 275 may be configured to operate with a drain voltage of 10V. Therefore, the number of type of diodes may be selected to reduce the voltage coming from the source contact 245 to the desired 10V. In other embodiments, an LNA may be configured to operate at a different drain voltage. In those embodiments, a different number or type of diodes may be selected to reduce the voltage output from the source contact 245 to the desired drain voltage of the LNA.

When the SPDT switches 105 and 110 are coupled to the transmit path 125, the control voltage supply 230 may output 0V. Therefore, the gate contact 210 of FET 205 may see a voltage of 0V, which may result in FET 205 being turned on. In other words, FET 205 may be attempting to draw current from the drain voltage supply 255 which may be supplying a voltage of 20V. However, due to the size of resistor 260, the current drawn by FET 205 may be very small, for example approximately 0.403 mA. Therefore, the voltage seen at the gate contact 240 of FET 235 may be very small. For example, in this embodiment the voltage seen at the gate contact 240 of FET 235 may be approximately 0.0161V.

The relatively small current at the gate contact 240 of FET 235 may cause the FET 235 to be very close to turned off. That is, the FET 235 may be drawing very little current from the drain voltage supply 255. This current may be considered leakage current. Because the FET 235 is drawing a very low current, the voltage of the source contact 245 may float to a voltage dependent on the drawn current. For example, in this embodiment the voltage at the source contact 245 may float to 3.4V.

As described above, the diodes 265 and 270 may serve to decrease the voltage from the voltage measured at the source contact 245 of FET 240 to the voltage measured at the drain contact 280 of FET 278 of the LNA 275. The decreased voltage may also result in a decreased current. For example, due to the decreased voltage the current across the FET 235 and the diodes 265 and 270 may be as low as 0.00356 mA. At such a low current the diodes may still drop a substantial amount voltage as shown in FIG. 3 at operating point 300. In this embodiment four or more such diodes may drop the voltage measured at the drain contact 280 of the FET 278 to approximately 0V. For example, the voltage measured at the drain contact 280 may be as low as 0.000335V.

Due to the relatively low current and voltage seen at the drain contact 280 of the FET 278 of the LNA 275, the FET 278 may attempt to draw additional current through the diodes 265 and 270. However, as shown in FIG. 3, additional current draw may result in an increased voltage drop across each diode, thereby maintaining a near 0V bias at drain contact 280. Therefore, the FET 278 may not be able to draw additional current because the voltage at drain contact 280 may be approximately equal to 0V. As a result, the LNA drain switch circuit 200 may serve to keep the current and voltage of the LNA 275 at a very low level when the MMIC 100 is in transmit mode.

Figure 4:
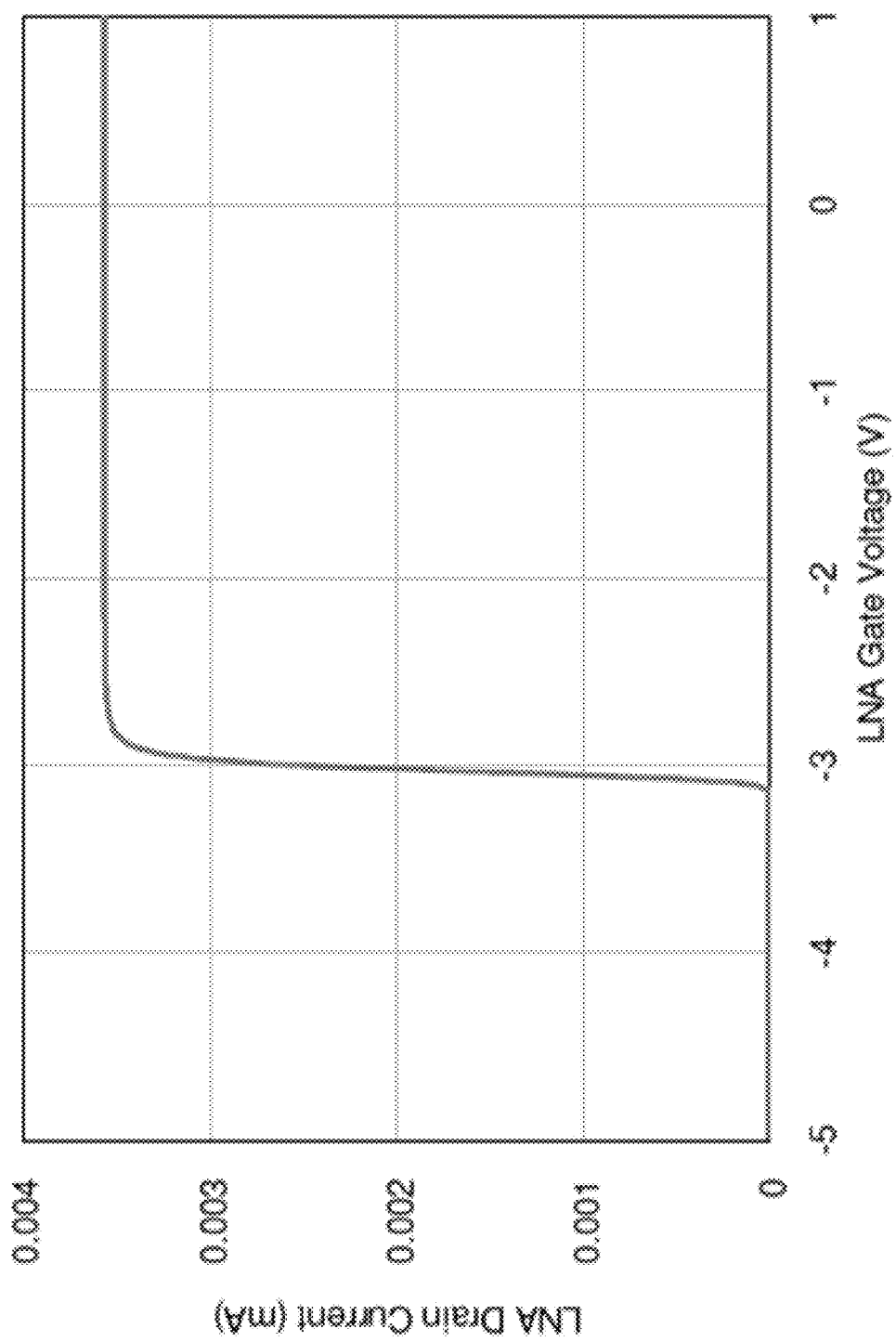
FIG. 4 illustrates an example of a voltage-current curve of an LNA coupled with an LNA drain switch circuit, in accordance with various embodiments.

FIG. 4 depicts an example current/voltage graph for an LNA 275 coupled with an LNA drain switch circuit 200 such as that depicted in FIG. 2. It is assumed for the purposes of this figure that the MMIC 100 is in transmit mode, that is the SPDT switches 105 and 110 are coupled with the transmit path 125. In this example, it can be seen that as the LNA gate voltage increases, for example from the gate voltage source 290, the current drawn from the LNA drain switch circuit 200 remains very low, on the order of 0.004 mA.

Figure 5:
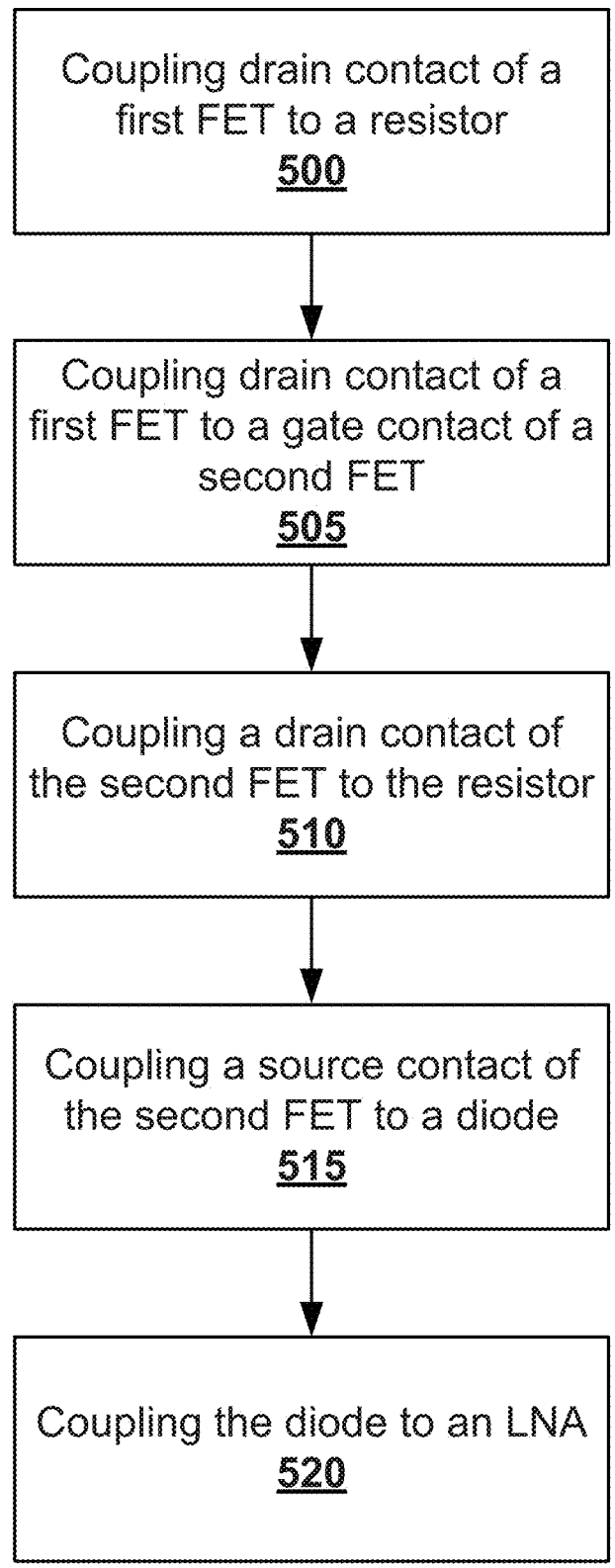
FIG. 5 illustrates an example process for constructing an LNA drain switch circuit, in accordance with various embodiments.

FIG. 5 depicts an example process for constructing the LNA drain switch circuit of FIG. 2. Initially, a drain contact such as drain contact 215 of FET 205 may be coupled with a resistor such as resistor 260 at 500. Further, the drain contact 215 may be coupled with a gate contact such as gate contact 240 of FET 235 at 505. Next, a drain contact such as drain contact 250 of the FET 235 may be coupled with the resistor at 510. A source contact such as source contact 245 of the FET 235 may be coupled with a diode such as diode 265 at 515. Finally, the diode may be coupled with an LNA such as LNA 275 at 520. As noted above, in some embodiments the diode may be coupled with an additional diode such as diode 270 between the diode 265 and the LNA 275. In that embodiment, the diode may not be directly coupled to the LNA at 520, but rather the diode may be considered to be electrically coupled with the LNA at 520.

Figure 6:
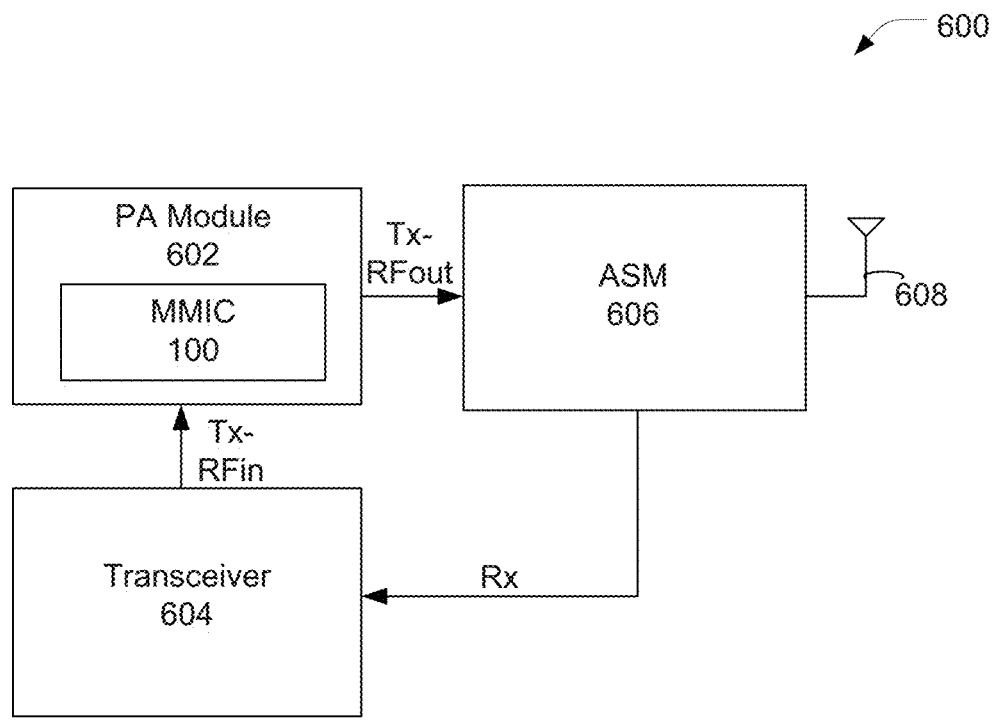
FIG. 6 is a block diagram of an exemplary wireless communication device, in accordance with various embodiments.

The MMIC 100, and specifically the LNA drain switch circuit 200 may be incorporated into a variety of systems. A block diagram of an example system 600 is illustrated in FIG. 6. As illustrated, the system 600 includes a power amplifier (PA) module 602, which may be a radio frequency (RF) PA module in some embodiments. The system 600 may include a transceiver 604 coupled with the PA module 602 as illustrated. The PA module 602 may include the MMIC 100 to perform any of a variety of operations such as amplification, switching, mixing, etc. In various embodiments, the MMIC 100 may additionally/alternatively be included in the transceiver 604 to provide, e.g., up-converting, or in an antenna switch module (ASM) 606 to provide various switching functions.

The PA module 602 may receive an RF input signal, RFin, from the transceiver 604. The PA module 602 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 6.

The amplified RF output signal, RFout, may be provided to the ASM 606, which effectuates an over-the-air (OTA) transmission of the RF output signal, RFout, via an antenna structure 608. The ASM 606 may also receive RF signals via the antenna structure 608 and couple the received RF signals, Rx, to the transceiver 604 along a receive chain.

In various embodiments, the antenna structure 608 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 600 may be any system including power amplification. In various embodiments, inclusion of the MMIC 100 in the system 600 to switch the RF signal may be particularly useful when the system 600 is used for power amplification at high RF power and frequency. For example, including the MMIC 100 into the system 600 may be especially beneficial for transmission of Global System for Mobile Communication (GSM) signals with a power approximately 32 dBm or greater and a frequency of approximately 1800 megahertz (MHz) or higher, as well as lower band GSM signals, e.g., 800 MHz to 915 MHz, having a power of approximately 34 dBm or greater.

The system 600 may be suitable for any one or more of terrestrial and satellite communications, radar systems, and possibly in various industrial and medical applications. More specifically, in various embodiments, the system 600 may be a selected one of a radar device, a satellite communication device, a mobile computing device (e.g., a phone, a tablet, a laptop, etc.), a base station, a broadcast radio, or a television amplifier system.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A low noise amplifier (LNA) drain switch circuit comprising:
    a first field effect transistor (FET) with a first gate contact, a first source contact, and a first drain contact;
    a second FET with a second gate contact, a second source contact, and a second drain contact, wherein the second gate contact is coupled with the first drain contact and the second drain contact is coupled with the second gate contact through a resistor; and
    a diode coupled with the second source contact.

2. The LNA drain switch circuit of claim 1, wherein the first gate contact is to receive a switch control voltage of a switch.

3. The LNA drain switch circuit of claim 2, wherein the switch control voltage is a negative voltage or a voltage at or near zero volts.

4. The LNA drain switch circuit of claim 1, wherein the LNA drain switch circuit is an LNA drain switch circuit of a monolithic microwave integrated circuit (MMIC).

5. The LNA drain switch circuit of claim 4, wherein the LNA drain switch circuit is coupled with an LNA in a receive path of the MMIC.

6. The LNA drain switch circuit of claim 4, wherein the MMIC is a Gallium Nitride (GaN) or Gallium Arsenide (GaAs) MMIC.

7. The LNA drain switch circuit of claim 1, wherein the diode is a first diode and further comprising a second diode coupled in series with the first diode.

8. The LNA drain switch circuit of claim 1, wherein the drain voltage supply is to receive a positive voltage.

9. A system comprising:
a drain voltage supply;
a control voltage supply; and
an integrated circuit (IC) coupled with the drain voltage supply and the control voltage supply, the IC comprising:
- a low noise amplifier (LNA);
- a first field effect transistor (FET) with a first gate contact coupled with the control voltage supply, and a first drain contact coupled with the drain voltage supply through a resistor;
- a second FET with a second gate contact coupled with the first drain contact, a second drain contact coupled with the drain voltage supply, and a source contact coupled with the LNA; and
- a diode electrically coupled with and positioned between the source contact and the LNA.

10. The system of claim 9, further comprising a switch coupled with the LNA and the control voltage supply, wherein the control voltage supply is to provide a control voltage to the switch.

11. The system of claim 9, wherein the IC is a monolithic microwave integrated circuit (MMIC).

12. The system of claim 11, wherein the MMIC is a Gallium Nitride (GaN) MMIC.

13. The system of claim 11, wherein the LNA is in a receive path of the MMIC.

14. The system of claim 13, further comprising a power amplifier (PA) in a transmit path of the MMIC.

15. The system of claim 9, wherein the diode is a first diode and further comprising a second diode coupled between the first diode and the LNA.

16. A method comprising:
- coupling a first drain contact of a first FET to a gate contact of a second FET;
- coupling a second drain contact of the second FET to the gate contact of the second FET through a resistor;
- coupling a source contact of the second FET to a diode; and
- coupling the diode to a low noise amplifier (LNA).

17. The method of claim 16, wherein the LNA is an LNA of a gallium nitride (GaN) monolithic microwave integrated circuit (MMIC).

18. The method of claim 17, wherein the LNA is an LNA of a receive path of the GaN MMIC.

19. The method of claim 17, wherein the gate contact is a second gate contact, and further comprising receiving, on a first gate contact of the first FET, a switch control voltage related to a switch coupled with the LNA.

20. The method of claim 16, wherein the diode is a first diode and further comprising coupling a second diode between the first diode and the LNA.

* * * * *

UNITED STATES PATENT AND TRADEMARK OFFICE
CERTIFICATE OF CORRECTION

| | | |
|---|---|---|
| PATENT NO. | : 9,276,538 B2 | Page 1 of 1 |
| APPLICATION NO. | : 14/222454 | |
| DATED | : March 1, 2016 | |
| INVENTOR(S) | : Charles F. Campbell | |

It is certified that error appears in the above-identified patent and that said Letters Patent is hereby corrected as shown below:

In the Specification:

In column 2, line 41, replace ""NB"" with --"A/B"--.

Signed and Sealed this
Seventeenth Day of May, 2016

Michelle K. Lee
*Director of the United States Patent and Trademark Office*